US011183586B2

(12) United States Patent
Yang et al.

(10) Patent No.: US 11,183,586 B2
(45) Date of Patent: Nov. 23, 2021

(54) CASCODE TRANSISTOR DEVICE

(71) Applicant: XIAMEN SANAN INTEGRATED CIRCUIT CO., LTD., Xiamen (CN)

(72) Inventors: Jian Yang, Xiamen (CN); Chih-Hung Yen, Xiamen (CN); Bin Li, Xiamen (CN)

(73) Assignee: Xiamen Sanan Integrated Circuit Co., Ltd., Xiamen (CN)

( * ) Notice: Subject to any disclaimer, the term of this patent is extended or adjusted under 35 U.S.C. 154(b) by 145 days.

(21) Appl. No.: 16/727,223

(22) Filed: Dec. 26, 2019

(65) Prior Publication Data

US 2020/0144402 A1  May 7, 2020

Related U.S. Application Data

(63) Continuation-in-part of application No. PCT/CN2018/086008, filed on May 8, 2018.

(30) Foreign Application Priority Data

Jun. 29, 2017 (CN) .......................... 201710516502.3

(51) Int. Cl.
| | |
|---|---|
| *H01L 29/732* | (2006.01) |
| *H01L 27/02* | (2006.01) |
| *H01L 27/06* | (2006.01) |
| *H01L 29/06* | (2006.01) |
| *H01L 29/207* | (2006.01) |
| *H01L 29/267* | (2006.01) |
| *H01L 21/02* | (2006.01) |

(52) U.S. Cl.
CPC .... *H01L 29/7325* (2013.01); *H01L 21/02576* (2013.01); *H01L 21/02579* (2013.01); *H01L 27/0203* (2013.01); *H01L 27/0605* (2013.01); *H01L 29/0603* (2013.01); *H01L 29/0684* (2013.01); *H01L 29/207* (2013.01); *H01L 29/267* (2013.01)

(58) Field of Classification Search
CPC .................................................. H01L 29/7325
See application file for complete search history.

(56) References Cited

U.S. PATENT DOCUMENTS

2006/0199348 A1*  9/2006  Bromberger ........ H01L 21/8221
                                                                438/309

\* cited by examiner

*Primary Examiner* — Julio J Maldonado
*Assistant Examiner* — Mohammad A Rahman
(74) *Attorney, Agent, or Firm* — Thomas | Horstemeyer, LLP

(57) ABSTRACT

A cascode transistor device includes a semiconductor substrate, and a first and a second compound semiconductor transistors. The first compound semiconductor transistor includes a first n-type doping layer, a first p-type doping layer and a second n-type doping layer sequentially disposed on the semiconductor substrate. The second compound semiconductor transistor includes a third n-type doping layer, a second p-type doping layer and a fourth n-type doping layer sequentially disposed on the second n-type doping layer. Each of these doping layers is formed with an exposed metal contact. The exposed metal contact on the second n-type doping layer is electrically connected to the exposed metal contact on the third n-type doping layer.

15 Claims, 2 Drawing Sheets

CASCODE TRANSISTOR DEVICE

CROSS-REFERENCE TO RELATED APPLICATION

This application is a continuation-in-part (CIP) of International Application No. PCT/CN2018/086008, filed on May 8, 2018, which claims priority to Chinese Invention Patent Application No. 201710516502.3, filed on Jun. 29, 2017.

FIELD

The disclosure relates to a compound semiconductor device, and more particularly to a cascode transistor device.

BACKGROUND

A conventional compound semiconductor transistor, such as a bipolar junction transistor (BJT), includes a first n-type doping layer (serving as a collector region), a p-type doping layer (serving as a base region) and a second n-type doping layer (serving as an emitter region). A cascode transistor device, which is widely used in a simulation or radio frequency (RF) circuit for higher breakdown voltage or higher operating voltage, includes the two abovementioned transistors disposed in a lateral arrangement on a common substrate and an insulating layer disposed between the two transistors and the substrate. In the cascode transistor device, a collector region of one of the transistors is electrically connected to an emitter region of the other one of the transistors via a wire.

As communication and information products are being rapidly developed, integrated circuits have been designed to fit into electronic devices on a miniature scale. However, such cascode transistor device in a lateral arrangement is unfavorable for miniaturization of the electronic devices due to large footprint and complicated wire connection between the two transistors.

SUMMARY

Therefore, an object of the disclosure is to provide a cascode transistor device that can alleviate at least one of the drawbacks of the prior art.

According to the disclosure, the cascode transistor device includes a semiconductor substrate, a first compound semiconductor transistor and a second compound semiconductor transistor. The first compound semiconductor transistor includes a first n-type doping layer, a first p-type doping layer and a second n-type doping layer disposed on the semiconductor substrate in such order. Each of the first n-type doping layer, the first p-type doping layer and the second n-type doping layer is formed with an exposed metal contact. The second compound semiconductor transistor includes a third n-type doping layer, a second p-type doping layer and a fourth n-type doping layer disposed on the second n-type doping layer of the first compound semiconductor transistor in such order. Each of the third n-type doping layer, the second p-type doping layer and the fourth n-type doping layer is formed with an exposed metal contact. The exposed metal contact on the second n-type doping layer is electrically connected to the exposed metal contact on the third n-type doping layer.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
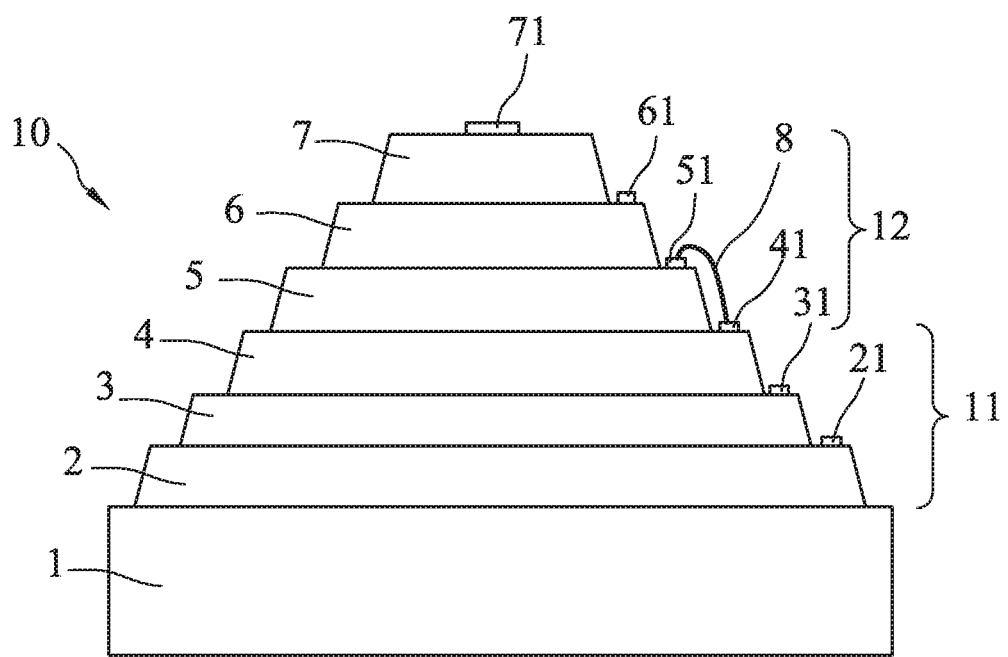
FIG. 1 is a schematic view illustrating an embodiment of a cascode transistor device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of the cascode transistor device 10 according to the disclosure includes two compound semiconductor transistors, i.e., a first compound semiconductor transistor 11 and a second compound semiconductor transistor 12 that are disposed on a semiconductor substrate 1 in a longitudinal and series connection. In certain embodiments, the semiconductor substrate 1 is made of Si, GaAs or InP.

The first compound semiconductor transistor 11 includes a first n-type doping layer 2, a first p-type doping layer 3 and a second n-type doping layer 4 that are disposed on the semiconductor substrate 1 in such order. The second compound semiconductor transistor 12 includes a third n-type doping layer 5, a second p-type doping layer 6 and a fourth n-type doping layer 7 that are disposed on the second n-type doping layer 4 of the first compound semiconductor transistor 11 in such order.

Each of the first n-type doping layer 2, the first p-type doping layer 3, the second n-type doping layer 4, the third n-type doping layer 5, the second p-type doping layer 6 and the fourth n-type doping layer 7 is formed with an exposed metal contact 21, 31, 41, 51, 61, 71. The exposed metal contact 21 on the first n-type doping layer 2 is spaced apart from the first p-type doping layer 3. The exposed metal contact 31 on the first p-type doping layer 3 is spaced apart from the second n-type doping layer 4. The exposed metal contact 41 on the second n-type doping layer 4 is spaced apart from the third n-type doping layer 5. The exposed metal contact 51 on the third n-type doping layer 5 is spaced apart from the second p-type doping layer 6. The exposed metal contact 61 on the second p-type doping layer 6 is spaced apart from the fourth n-type doping layer 7. The exposed metal contact 71 is disposed on a top surface of the fourth n-type doping layer 7. Each of the exposed metal contacts 21, 31, 41, 51, 61, 71 is made of a metal material. Examples of the metal material may include, but are not limited to, Ti, Au, Pt, Ni, TiW and combinations thereof.

In this embodiment, the exposed metal contact 41 on the second n-type doping layer 4 is electrically connected to the exposed metal contact 51 on the third n-type doping layer 5 via a metal wire 8, which may be made of the metal material as mentioned above. The first n-type doping layer 2, the first p-type doping layer 3 and the second n-type doping layer 4 of the first compound semiconductor transistor 11 are respectively formed as a collector region, a base region and an emitter region. The third n-type doping layer 5, the second p-type doping layer 6 and the fourth n-type doping layer 7 of the second compound semiconductor transistor 12 are respectively formed as a collector region, a base region and an emitter region. That is, the emitter region of the first compound semiconductor transistor 11 and the collector region of the second compound semiconductor transistor 12 are electrically connected in series.

The first and second compound semiconductor transistors 11, 12 may be heterojunction bipolar transistors. The first n-type doping layer 2, the first p-type doping layer 3, the second n-type doping layer 4, the third n-type doping layer 5, the second p-type doping layer 6 and the fourth n-type doping layer 7 are independently made of a material selected from the group consisting of GaAs-, AlGaAs-, InGaP-, InP- and InGaAs-based compound semiconductor materials. In certain embodiments, the material of the doping layers 2, 3, 4, 5, 6 and 7 are the same. For example, these doping layers are made of GaAs-based compound semiconductor material. In certain embodiments, each of the first, second, third and fourth n-type doping layers 2, 4, 5, 7 is doped with Si or Te, and each of the first and second p-type doping layers 3, 6 is doped with C, Be or Zn.

In certain embodiments, the first n-type doping layer 2 has a doping concentration ranging from $1\times10^{16}$ cm$^{-3}$ to $1\times10^{13}$ cm$^{-3}$, the first p-type doping layer 3 has a doping concentration ranging from $5\times10^{10}$ cm$^{-3}$ to $1\times10^{20}$ cm$^{-3}$, and the second n-type doping layer 4 has a doping concentration ranging from $1\times10^{17}$ cm$^{-3}$ to $7\times10^{17}$ cm$^{-3}$. In other embodiments, the third n-type doping layer 5 has a doping concentration ranging from $1\times10^{16}$ cm$^{-3}$ to $1\times10^{19}$ cm$^{-3}$, the second p-type doping layer 6 has a doping concentration ranging from $5\times10^{18}$ cm$^{-3}$ to $1\times10^{20}$ cm$^{-3}$, and the fourth n-type doping layer 7 has a doping concentration ranging from $1\times10^{17}$ cm$^{-3}$ to $7\times10^{17}$ cm$^{-3}$.

The doping layers having the same function in the first and second compound semiconductor transistors 11 and 12 (such as the first n-type doping layer 2 of the first compound semiconductor transistor 11 and the third n-type doping layer 5 of the second compound semiconductor transistor 12 both serving as collector regions) may be doped with a same dopant in a same doping concentration and may have a same thickness, but is not limited thereto. That is, the dopant, the doping concentration and the thickness of these doping layers may be individually adjusted and optimized according to practical requirements. In certain embodiments, when the second n-type doping layer 4 of the first compound semiconductor transistor 11 and the third n-type doping layer 5 of the second compound semiconductor transistor 12 have the same doping concentration (such as $1\times10^{18}$ cm$^{-3}$), these two doping layers may be formed as a single-layered structure or the doping concentrations thereof may be adjusted simultaneously to adapt to the desired applications.

In this embodiment, the first n-type doping layer 2, the first p-type doping layer 3, the second n-type doping layer 4, the third n-type doping layer 5, the second p-type doping layer 6 and the fourth n-type doping layer 7 are arranged in a stepwise configuration. Each of these doping layers 2, 3, 4, 5, 6, 7 has a dimension such that the first n-type doping layer 2, the first p-type doping layer 3, the second n-type doping layer 4, the third n-type doping layer 5, the second p-type doping layer 6 and the fourth n-type doping layer 7 descend in such order in terms of dimension.

The cascode transistor device 10 of this disclosure may be manufactured using techniques well known to those skilled in the art. In this embodiment, each of the abovementioned doping layers 2, 3, 4, 5, 6, 7 is sequentially formed on the semiconductor substrate 1 using metal organic chemical vapor deposition (MOCVD). The thus formed doping layers 2, 3, 4, 5, 6, 7 are subjected to an etching process to expose part of surfaces thereof, such that these doping layers 2, 3, 4, 5, 6, 7 are arranged in the stepwise configuration as mentioned above. The exposed metal contacts 21, 31, 41, 51, 61, 71 are then respectively formed on the exposed surfaces of the doping layers 2, 3, 4, 5, 6, 7 by virtue of metal deposition. The metal wire 8 may be simply formed by metal deposition, and is connected between the exposed metal contacts 41 and 51 across a height of the third n-type doping layer 5. In contrast to two transistors disposed in a lateral arrangement, which requires a longer metal wire due to the difference between longitudinal and lateral distances of said two transistors for accomplishing electrical connection between a collector region of one transistor and an emitter region of the other transistor (i.e., across two metal layers), the longitudinal arrangement of the two transistors simplifies the wire connection and decreases the footprint of the compound semiconductor transistors in the cascode transistor device 10. It should be noted that the metal wire 8 shown in FIG. 1 is merely exemplified as a connector, and its actual structure is implemented by a semiconductor process which is well known to those skilled in the art.

Figure 2:
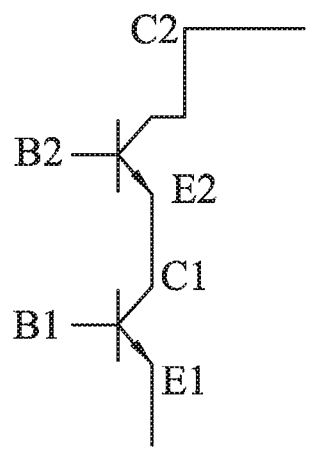
FIG. 2 is a circuit diagram of the embodiment of the cascode transistor device.

Referring to FIG. 2, a circuit diagram of the embodiment is shown. The cascode transistor device 10 can be deemed as a four-terminal device, which has one bottom emitter region (E1), one top collector region (C2) and two base regions (B1, B2). The breakdown voltage of the first compound semiconductor transistor 11 and the second compound semiconductor transistor 12 can be summed up to increase the range of operating voltage of the cascode transistor device 10. With this arrangement, the cascode transistor device 10 provides a high breakdown voltage and excellent RF power performance, and thus can be suitably used in simulation or RF circuits for increasing the breakdown voltage or operating voltage of the heterojunction bipolar transistors thereof.

Figure 3:
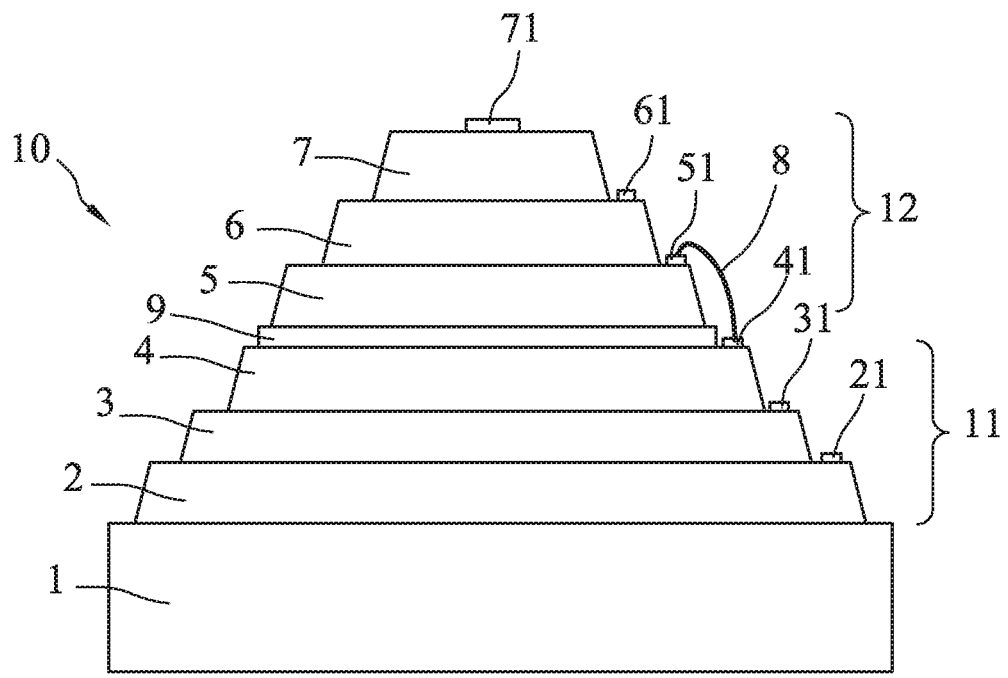
FIG. 3 is a schematic view illustrating a variation of the embodiment of the cascode transistor device according to the disclosure.

Referring to FIG. 3, in a variation of the embodiment, the cascode transistor device 10 further includes an etch stop layer 9 disposed between the second n-type doping layer 4 and the third n-type doping layer 5 for better control of the etching process. The exposed metal contact 41 on the second n-type doping layer 4 is spaced apart from the etch stop layer 9.

In certain embodiments, the doping layers 2, 3, 4 of the first compound semiconductor transistor 11 and the doping layers 5, 6, 7 of the second compound semiconductor transistor 12 are made of a GaAs-based compound semiconductor material, and the etch stop layer 9 is made of InGaP.

In other embodiments, the doping layers 2, 3, 4 of the first compound semiconductor transistor 11 and the doping layers 5, 6, 7 of the second compound semiconductor transistor 12 are made of a InP-based compound semiconductor material, and the etch stop layer 9 is made of InP.

In conclusion, with the first and second compound semiconductor transistors 11, 12 stacked and electrically connected together in a longitudinal arrangement, the cascode transistor device 10 of this disclosure not only has a reduced footprint and decreased manufacturing cost (i.e., without need of complicated traces), but also provides excellent breakdown voltage and RF power performance.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A cascode transistor device, comprising:
   a semiconductor substrate;
   a first compound semiconductor transistor including a first n-type doping layer, a first p-type doping layer and a second n-type doping layer sequentially disposed on said semiconductor substrate in such order, each of said first n-type doping layer, said first p-type doping layer and said second n-type doping layer being formed with an exposed metal contact; and
   a second compound semiconductor transistor including a third n-type doping layer, a second p-type doping layer and a fourth n-type doping layer sequentially disposed on said second n-type doping layer of said first compound semiconductor transistor, each of said third n-type doping layer, said second p-type doping layer and said fourth n-type doping layer being formed with an exposed metal contact;
   wherein said exposed metal contact on said second n-type doping layer is electrically connected to said exposed metal contact on said third n-type doping layer.

2. The cascode transistor device of claim 1, wherein said first n-type doping layer, said first p-type doping layer and said second n-type doping layer of said first compound semiconductor transistor are formed as a collector region, a base region and an emitter region, respectively.

3. The cascode transistor device of claim 2, wherein said third n-type doping layer, said second p-type doping layer and said fourth n-type doping layer of said second compound semiconductor transistor are formed as a collector region, a base region and an emitter region, respectively.

4. The cascode transistor device of claim 1, wherein said first n-type doping layer, said first p-type doping layer, said second n-type doping layer, said third n-type doping layer, said second p-type doping layer and said fourth n-type doping layer are arranged in a stepwise configuration and each has a dimension such that said first n-type doping layer, said first p-type doping layer, said second n-type doping layer, said third n-type doping layer, said second p-type doping layer and said fourth n-type doping layer descend in such order in terms of dimension.

5. The cascode transistor device of claim 1, wherein each of said first n-type doping layer, said first p-type doping layer, said second n-type doping layer, said third n-type doping layer, said second p-type doping layer and said fourth n-type doping layer is made of a material selected from the group consisting of GaAs-, AlGaAs-, InGaP-, InP- and InGaAs-based compound semiconductor materials.

6. The cascode transistor device of claim 1, wherein said first n-type doping layer has a doping concentration ranging from $1 \times 10^{16}$ cm$^{-3}$ to $1 \times 10^{19}$ cm$^{-3}$.

7. The cascode transistor device of claim 1, wherein said first p-type doping layer has a doping concentration ranging from $5 \times 10^{10}$ cm$^{-3}$ to $1 \times 10^{20}$ cm$^{-3}$.

8. The cascode transistor device of claim 1, wherein said second n-type doping layer has a doping concentration ranging from $1 \times 10^{17}$ cm$^{-3}$ to $7 \times 10^{17}$ cm$^{-3}$.

9. The cascode transistor device of claim 1, wherein said third n-type doping layer has a doping concentration ranging from $1 \times 10^{16}$ cm$^{-3}$ to $1 \times 10^{19}$ cm$^{-3}$.

10. The cascode transistor device of claim 1, wherein said second p-type doping layer has a doping concentration ranging from $5 \times 10^{18}$ cm$^{-3}$ to $1 \times 10^{20}$ cm$^{-3}$.

11. The cascode transistor device of claim 1, wherein said fourth n-type doping layer has a doping concentration ranging from $1 \times 10^{17}$ cm$^{-3}$ to $7 \times 10^{17}$ cm$^{-3}$.

12. The cascode transistor device of claim 1, further comprising an etch stop layer disposed between said second n-type doping layer and said third n-type doping layer.

13. The cascode transistor device of claim 12, wherein said etch stop layer is made of InGaP, and said first n-type doping layer, said first p-type doping layer and said second n-type doping layer of said first compound semiconductor transistor and said third n-type doping layer, said second p-type doping layer and said fourth n-type doping layer of said second compound semiconductor transistor are made of a GaAs-based compound semiconductor materials.

14. The cascode transistor device of claim 12, wherein said etch stop layer is made of InP, and said first n-type doping layer, said first p-type doping layer and said second n-type doping layer of said first compound semiconductor transistor and said third n-type doping layer, said second p-type doping layer and said fourth n-type doping layer of said second compound semiconductor transistor are made of a InP-based compound semiconductor material.

15. The cascode transistor device of claim 1, wherein each of said exposed metal contacts is made of a metal material selected from the group consisting of Ti, Au, Pt, Ni, TiW and combinations thereof.

* * * * *